United States Patent [19]

Everest et al.

[11] 3,731,117

[45] May 1, 1973

[54] ELECTRONIC GATING CIRCUITS

[75] Inventors: Frank G. Everest, Stevenage; Thomas P. Veasey, Hitchin, both of England

[73] Assignee: British Aircraft Corporation Limited, London, England

[22] Filed: Dec. 3, 1971

[21] Appl. No.: 204,458

[30] Foreign Application Priority Data

Dec. 4, 1970 Great Britain....................57,808/70

[52] U.S. Cl. ..................307/254, 307/246, 307/255, 328/151, 330/25

[51] Int. Cl. ..........................................H03k 17/60

[58] Field of Search......................307/246, 254, 255; 328/151; 330/25

[56] References Cited

UNITED STATES PATENTS

| | | | |
|---|---|---|---|
| 3,188,492 | 6/1965 | Bymers | 307/255 X |
| 3,207,998 | 9/1965 | Corney et al. | 328/151 X |
| 3,336,518 | 8/1967 | Murphy | 328/151 X |

*Primary Examiner*—John Zazworsky
*Attorney*—Solomon B. Kemon et al.

[57] ABSTRACT

In an electronic circuit in which a gating circuit is connected between a transistor or other semi-conductor element and an output terminal, the offset normally introduced by the transistor is cancelled by a compensating circuit responsive to variations in the D.C. level of the current passed by the transistor in the intervals between gating periods to derive a compensating signal which is operative during the gating periods to modify the output signal.

9 Claims, 1 Drawing Figure

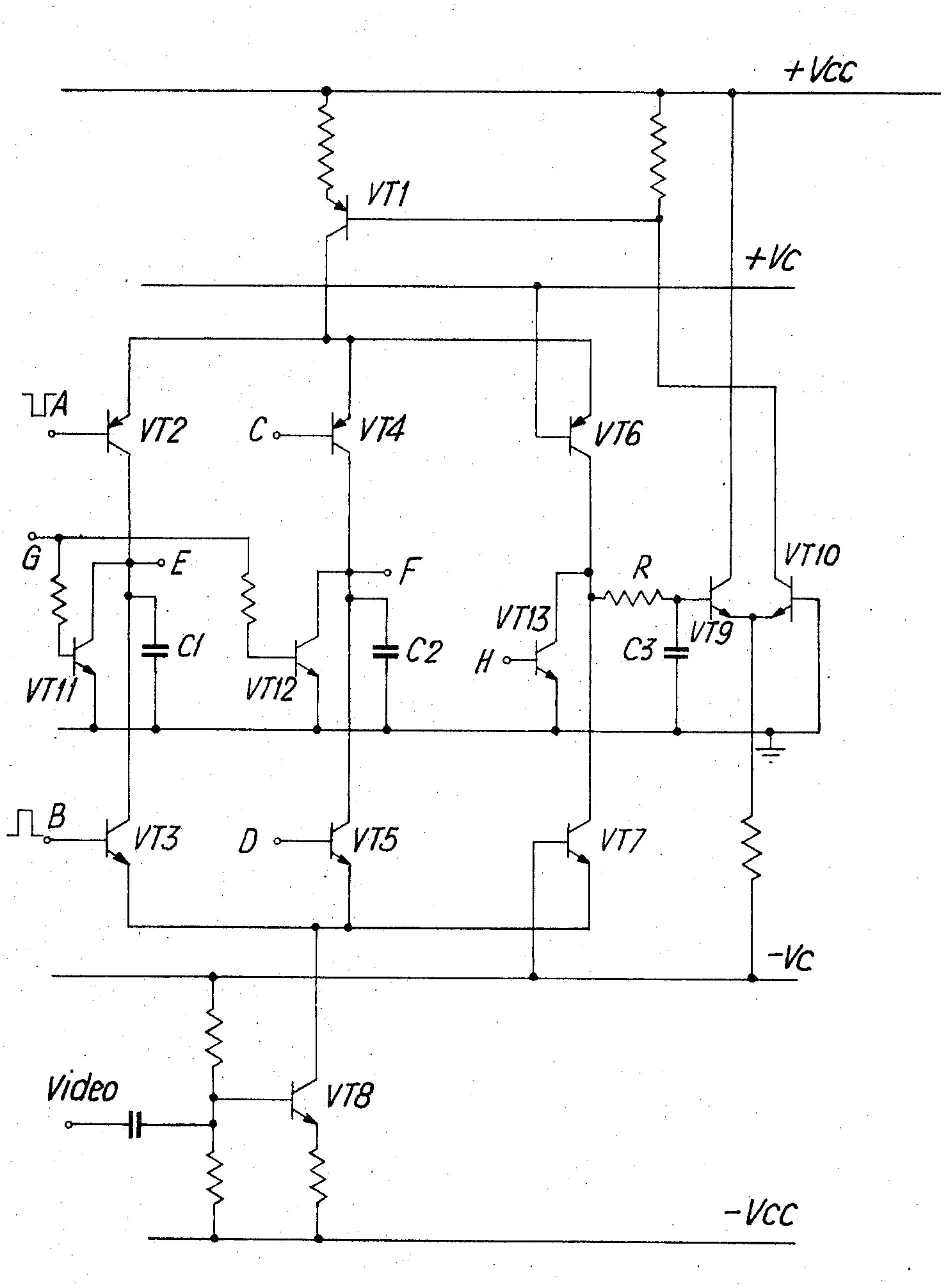
+Vcc
VT1
+Vc
A
VT2
C
VT4
VT6
G
E
F
R
VT10
C1
C2
VT13
C3
VT9
VT11
VT12
H
B
VT3
D
VT5
VT7
-Vc
Video
VT8
-Vcc

ELECTRONIC GATING CIRCUITS

This invention concerns an electronic gating circuit which may be applied to rangefinders, for example. The invention has for its object to compensate for offset introduced by a semi-conductor element through which passes a signal current applied to an input terminal.

The circuit according to the present invention has a gating circuit connected between the semi-conductor element and an output terminal, means for applying gating pulses to the gating circuit to cause an output signal to be applied to the output terminal during gating periods, a compensating circuit including means coupled to the semi-conductor element and responsive to variations in the D.C. level of the current passed by the semi-conductor element in the intervals between gating periods to derive a compensating signal for balancing any signal offset introduced by the semi-conductor element, and means responsive to the compensating signal and operative during the gating periods to modify the output signal with the compensating signal.

In the preferred circuit embodying the invention, a semi-conductor element similar to that which receives the input signal is connected effectively in series with the latter and a circuit responsive to the difference in the currents passed by these two elements adjusts the input to the further semi-conductor element in such a sense as to tend to remove the difference. The compensating signal may be applied to the output of the first gating circuit by means of a further gating circuit operating simultaneously with the first. The gating elements may be complementary transistors connected so that the signal level at their junction represents the output signal and is substantially free from offset due to the semi-conductor elements. A capacitor may be connected to this junction to store the signal sample.

A second pair of complementary transistors may be connected in series between the two semi-conductor elements associated with the feedback circuit, the second pair of complementary transistors being gated alternately with the first pair, for example. Such a circuit may be used in a rangefinder working on the "split gate" principle, for which purpose the signals derived at the junctions of the two pairs of complementary transistors are taken to a comparator the output of which is used to adjust the time-position of the gating pulses until the incoming range signal is approximately shared between the two gating intervals.

In order that the invention maybe better understood, one example will now be described with reference to the accompanying drawing.

In the drawing a signal which may be the video output of a rangefinder is continuously fed into a transistor VT8 which also supplies a standing current due to its forward bias. In the absence of gating pulses at transistors VT2, VT3, VT4 and VT5, the current is fully diverted into the emitter of npn transistor VT7, the base of which is connected to the supply line - Vc. In series with transistor VT7 is a transistor VT6 which is also conducting and the emitter of which is connected to the collector of a transistor VT1 receiving the current from the transistor VT8. Provided that VT13 is held off by keeping terminal H at 0 volts or below, any imbalance in the DC currents supplied by VT1 and VT8 causes an offset voltage at the base of transistor VT9. The emitter-coupled transistors VT9 and VT10 operate to adjust the collector current of transistor VT1 so as to reduce the difference voltage at the base of transistor VT9, the collector of transistor VT10 being connected to the base of transistor VT1. Hence the collector currents of transistors VT1 and VT8 are maintained almost identical as far as DC is concerned, the collector current of VT1 constituting the compensating signal.

To gate the incoming signal, gating pulses of opposite polarity are applied at A and B to drive pnp transistor VT2 and the complementary npn transistor VT3 to their conducting conditions. When this happens, the currents from transistors VT8 and VT1 no longer flow through transistors VT7 and VT6 but are diverted through transistors VT3 and VT2 respectively. Any video signal voltage at the base of transistor VT8 which departs from the DC level and hence alters the instantaneous current at the collector of transistor VT8 is wholly diverted into capacitor C1 connected to the junction of transistors VT2 and VT3. Thus, capacitor C1 accumulates voltage at a rate dependent on the video signal current and the value of the capacitor. When the gating pulses are removed from A and B, the capacitor charge is stored and can be used as one input for a split-gate rangefinding system. Gating pulses of opposite polarities applied to C and D will similarly cause transistors VT4 and VT5 to conduct and to store the video signal on capacitor C2. Thus, capacitor C2 can provide the other input to a split-gate circuit of a rangefinding system, the outputs E and F being taken to the inverting and non-inverting inputs of a differential amplifier to indicate any error voltage due to incorrect positioning of the gating pulses over the video signal waveform. It will be clear that more than two gating periods can be obtained if desired, the successiVe pulses to the pairs of inputs A and B or C and D storing the total video signal inputs during the relevant gating periods on capacitors C1 and C2. Since no DC variation of voltage occurs in capacitor C1 and C2, the total time for which VT2 and VT3 or VT4 and VT5 are conducting does not need to be identical to balance the outputs E and F under no signal conditions.

Transistors VT11 and VT12 are used to clear the video informatiOn on capacitors C1 and C2 before the arrival of the next set of gating pulses. A clearing pulse at G drives transistors VT11 and VT12 to a fully conducting condition, thereby clamping the output terminals E and F to ground.

Transistor VT13 is driven on whenever signal pulses are expected so that video information does not alter the DC level accumulated in capacitor C3. Thus, if signals are expected for only a small percentage of the total time between pulses, transistor VT13 is driven on for only that percentage of the total time. Due allowance for the effective time during which VT13 is on has therefore to be made in the choice of values of C3 and R to give the desired decay time constant.

It will be appreciated that with the circuit described above signal gating is obtained using normal transistors, the offset normally introduced by the transistors being cancelled by a feedback system. Another advantage of this circuit is that the signal information during the gating period may be stretched to any desired extent, dependent on the pulse repetition frequency of the pulses to be passed by the gating system.

We claim:

1. An electronic circuit comprising:

a semi-conductor element connected to pass a signal current applied to an input terminal, a gating circuit connected between the semi-conductor element and an output terminal, and means for applying gating pulses to the gating circuit to cause an output signal to be applied to the output terminal during gating periods, and further comprising:

a compensating circuit including means coupled to the semi-conductor element and responsive to variations in the D.C. level of the current passed by the semi-conductor element in the intervals between gating periods to derive a compensating signal for balancing any signal offset introduced by the said semi-conductor element; and means responsive to the compensating signals and operative during the gating periods to modify the said output signal with the said compensating signal.

2. An electronic circuit in accordance with claim 1, in which the means for modifying the output signal with the compensating signal comprises a further gating circuit connected to receive the said gating pulses applied to the first gating circuit and coupling the means for deriving the compensating signal to the first gating circuit.

3. An electronic circuit in accordance with claim 1, in which the said semi-conductor element is a transistor connected to receive the input signal at its base.

4. An electronic circuit in accordance with claim 1, in which the compensating circuit includes a further semi-conductor element, similar to the first, and a comparator responsive to the difference in the D.C. levels of the currents passed by the two semi-conductor elements to adjust the input to the further semi-conductor element in such a sense as to tend to remove the difference.

5. An electronic circuit in accordance with claim 4, in which the compensating circuit includes a pair of complementary transistors the current-conducting paths of which are connected in series with one another and with the current-conducting paths of the first semi-conductor element, on one side, and of the further semi-conductor element, on the other side, the junction of the said complementary transistors being connected through a smoothing circuit to the said comparator.

6. An electronic circuit in accordance with claim 4, in which the gating circuit comprises a pair of semi-conductor gating elements of complementary kinds connected in series between the said semi-conductor elements and means for applying to the gating elements simultaneous gating pulses of opposite polarities to render them conductive when the input signal is to be sampled by the gate, the signal at the junction of the said gating elements constituting the signal sample.

7. An electronic circuit in accordance with claim 6, in which a capacitor is connected to the junction of the said gating elements to store the signal sample.

8. An electronic circuit in accordance with claim 6, in which the gating circuit includes at least two parallel circuits, each including a pair of semi-conductor gating elements connected in series between the said current-controlling semi-conductor elements, means for applying gating pulses of opposite polarities simultaneously to the gating elements of a pair, and timing means whereby the gating pulses applied to different pairs of gating elements are generated in cyclic succession.

9. A rangefinder of the "split gate" kind including an electronic circuit according to claim 8 having two pairs of semi-conductor gating elements, the junctions of which provide two signal samples gated from the incoming signal at different sampling times.

* * * * *